United States Patent
Daryanani et al.

(10) Patent No.: US 10,700,171 B2
(45) Date of Patent: Jun. 30, 2020

(54) NON-VOLATILE FLASH MEMORY CELL

(71) Applicant: Microchip Technology Incorporated, Chandler, AZ (US)

(72) Inventors: Sonu Daryanani, Tempe, AZ (US); Bomy Chen, Newark, CA (US); Mel Hymas, Camas, WA (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 66 days.

(21) Appl. No.: 15/887,088

(22) Filed: Feb. 2, 2018

(65) Prior Publication Data

US 2018/0233371 A1 Aug. 16, 2018

Related U.S. Application Data

(60) Provisional application No. 62/458,856, filed on Feb. 14, 2017.

(51) Int. Cl.
*H01L 21/28* (2006.01)
*H01L 27/11521* (2017.01)
(Continued)

(52) U.S. Cl.
CPC .. *H01L 29/40114* (2019.08); *H01L 27/11521* (2013.01); *H01L 29/0649* (2013.01);
(Continued)

(58) Field of Classification Search
CPC ......... H01L 27/11517; H01L 27/11519; H01L 27/11521; H01L 27/11524; H01L 29/0649;
(Continued)

(56) References Cited

U.S. PATENT DOCUMENTS

| 8,405,140 B2 * | 3/2013 | Io | H01L 27/115 257/317 |
|---|---|---|---|
| 2002/0102774 A1 | 8/2002 | Kao et al. | 438/142 |

(Continued)

OTHER PUBLICATIONS

Chang, Yi-Shiang et al., "Pattern Decomposition and Process Integration of Self-Aligned Double Patterning for 30nm Node NAND FLASH Process and Beyond," Proceedings of SPIE, vol. 7274, 9 pages, Mar. 16, 2009.

(Continued)

*Primary Examiner* — Sue A Purvis
*Assistant Examiner* — Scott Stowe
(74) *Attorney, Agent, or Firm* — Slayden Grubert Beard PLLC

(57) ABSTRACT

A method for manufacturing a flash memory device on a substrate may include: preparing the substrate with shallow trench isolation to define active sections; depositing a floating gate oxide layer on the prepared substrate; depositing a floating gate polysilicon layer on the floating gate oxide layer; polishing the floating gate polysilicon layer to isolate a plurality of floating gates above the active sections of the substrate; depositing a silicon nitride layer on top of the plurality of floating gates; patterning and etching the silicon nitride layer to create silicon nitride features; depositing a set of oxide spacers along sides of the silicon nitride features; implanting a source junction into the substrate beneath the individual floating gates; removing the floating gate polysilicon layer except where beneath individual oxide spacers, then removing the set of oxide spacers; depositing an inter-poly layer on top of the remaining floating gates; depositing a second polysilicon layer on top of the inter-poly layer; and patterning and etching the second polysilicon layer to separate the second polysilicon layer into word line devices and erase gates.

14 Claims, 10 Drawing Sheets

(51) Int. Cl.
*H01L 29/423* (2006.01)
*H01L 29/788* (2006.01)
*H01L 29/06* (2006.01)
*H01L 29/66* (2006.01)

(52) U.S. Cl.
CPC .. *H01L 29/42328* (2013.01); *H01L 29/66825* (2013.01); *H01L 29/7881* (2013.01)

(58) Field of Classification Search
CPC ......... H01L 29/42328; H01L 29/66825; H01L 29/7881; H01L 29/40114
See application file for complete search history.

(56) References Cited

U.S. PATENT DOCUMENTS

| | | | |
|---|---|---|---|
| 2006/0258076 A1 | 11/2006 | Mizushima et al. | 438/201 |
| 2009/0200600 A1* | 8/2009 | Nagai | H01L 21/28273 |
| | | | 257/324 |
| 2016/0020216 A1 | 1/2016 | Lin et al. | 257/316 |
| 2016/0225776 A1 | 8/2016 | Chuang et al. | 257/316 |

OTHER PUBLICATIONS

Partial International Search Report and Written Opinion, Application No. PCT/US2018/017233, 12 pages, dated May 15, 2018.
International Search Report and Written Opinion, Application No. PCT/US2018/017233, 18 pages, dated Jul. 10, 2018.

* cited by examiner

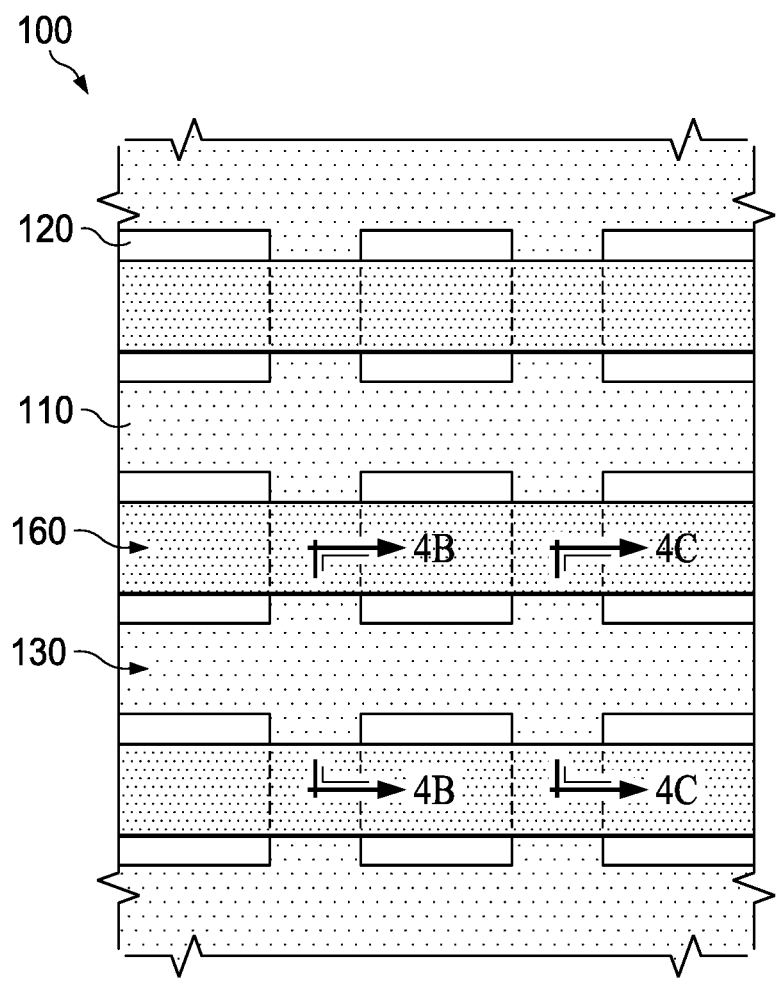
FIG. 4A
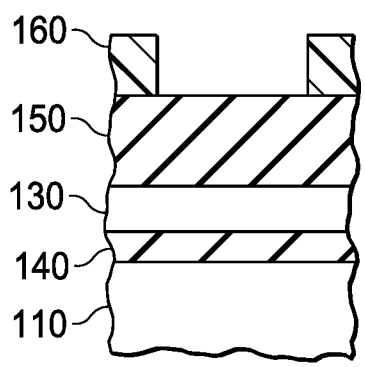
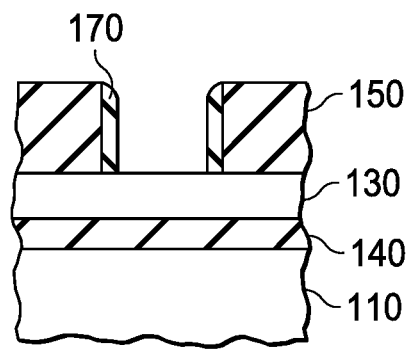
FIG. 4B   FIG. 4C

NON-VOLATILE FLASH MEMORY CELL

CROSS-REFERENCE TO RELATED APPLICATIONS

This application claims priority to commonly owned U.S. Provisional Patent Application No. 62/458,856 filed Feb. 14, 2017, which is hereby incorporated by reference herein for all purposes.

TECHNICAL FIELD

The present disclosure relates to semiconductor devices and the teachings thereof may be embodied in non-volatile flash memory cells and processes for the manufacture of semiconductor devices.

BACKGROUND

Flash memory is an electronic component used as a computer storage medium, typically comprising a solid-state memory device. NAND-type flash memory may be written and read in blocks and/or pages. It is typically used in memory cards, USB flash drives, and solid-state drives for general storage and transfer of data. NOR-type flash memory may allow writing and reading a single machine word and/or byte. The NOR-based flash devices may require longer erase and/or write times, but provide full address and data buses allowing random access to any memory location. NOR-based devices may be more appropriate for program code that is rarely updated, e.g., a computer BIOS or component firmware.

Flash memory stores data in an array of memory cells comprising floating-gate transistors. Each memory cell may include two gates, a control gate and a floating gate insulated by an oxide layer. FIG. 1 shows a prior art flash memory cell 1 comprising two select gates 10, a control gate 20, a source junction 30 under the control gate 20, a drain junction 40, and a floating gate 50. There is a layer of oxide surrounding the various components. The floating gate 50 can be connected to the source junction 30 by the control gate 20, sometimes referred to as an erase gate. Floating gate 50 can be connected to the drain junction 40 by select gate 10, sometimes referred to as a word line device. The various dimensions of each feature are limited by the manufacturing processes used. Of course, the smaller the dimensions are, the more memory cells 1 may be arrayed in the same size chip and/or device.

SUMMARY

Hence, a process or method that reduces the critical dimensions of a flash memory cell may provide for improved cell density and/or reduced cost for a flash memory device. According to various embodiments of the teachings of the present disclosure, manufacturing processes may leverage a reduced floating side-wall coupling ratio between the word line device and the erase gate to reduce both the footprint and the required operating voltage.

For example, a method for manufacturing a flash memory device on a substrate may include: preparing the substrate with shallow trench isolation to define and separate active sections; depositing a floating gate oxide layer on the prepared substrate; depositing a floating gate polysilicon layer on the floating gate oxide layer; polishing the floating gate polysilicon layer to isolate a plurality of floating gates above the active sections of the substrate; depositing a silicon nitride layer on top of the plurality of floating gates; patterning and etching the silicon nitride layer to create silicon nitride features; depositing a set of oxide spacers along sides of the silicon nitride features; implanting a source junction into the substrate beneath the individual floating gates; removing the floating gate polysilicon layer except where beneath individual oxide spacers, then removing the set of oxide spacers; depositing an inter-poly layer on top of the remaining floating gates; depositing a second polysilicon layer on top of the inter-poly layer; and patterning and etching the second polysilicon layer to separate the second polysilicon layer into word line devices and erase gates.

In some embodiments, patterning and etching the silicon nitride layer includes: depositing a photoresist layer on the silicon nitride layer; patterning the photoresist layer; and etching the silicon nitride layer where exposed by the photoresist layer.

In some embodiments, the individual oxide spacers have a dimension of about 120 nanometers.

In some embodiments, the remaining floating gates have a dimension of about 120 nanometers.

In some embodiments, the second polysilicon layer has a thickness greater than one half times a distance between adjacent remaining floating gates.

In some embodiments, a distance between adjacent floating gates is approximately 390 nanometers.

In some embodiments, the word line devices have a dimension of approximately 0.18 micrometers.

In some embodiments, a gap between the word line devices and the erase gate is approximately 0.04 micrometers.

As another example, a flash memory device may include: a substrate with shallow trench isolation defining and separating active sections; a floating gate oxide layer disposed on the substrate; a floating gate polysilicon layer on the floating gate oxide layer opposite the substrate, defining a plurality of floating gates above the active sections of the substrate; a silicon nitride layer defining silicon nitride features on top of the plurality of floating gates; a set of spaces along multiple sides of the silicon nitride features; a source junction implanted into the substrate beneath the individual floating gates; the floating gate polysilicon layer only present beneath individual the set of spaces; an inter-poly layer on top of the floating gates; a second polysilicon layer on top of the inter-poly layer, patterned and etched to separate the second polysilicon layer into word line devices and erase gates.

In some embodiments, each space in the set of spaces has a dimension of about 120 nanometers.

In some embodiments, each of the floating gates has a dimension of about 120 nanometers.

In some embodiments, the second polysilicon layer has a thickness greater than one half times a distance between adjacent floating gates.

In some embodiments, a distance between adjacent floating gates is approximately 390 nanometers.

In some embodiments, each of the word line devices has a dimension of approximately 0.18 micrometers.

In some embodiments, a gap between each of the word line devices and an adjacent erase gate is approximately 0.04 micrometers.

BRIEF DESCRIPTION OF THE DRAWINGS

FIGS. 4A-4C are schematic drawings showing portions of a manufacturing process according to teachings of the present disclosure;

DETAILED DESCRIPTION

The teachings of the present disclosure may be embodied in various processes or methods to reduce the critical dimensions of a flash memory cell. These processes may provide improved cell density and/or reduced cost for a flash memory device. In some embodiments, the manufacturing processes may leverage a reduced floating side-wall coupling ratio between the word line device and the erase gate to reduce both the footprint and the required operating voltage.

Figure 1:
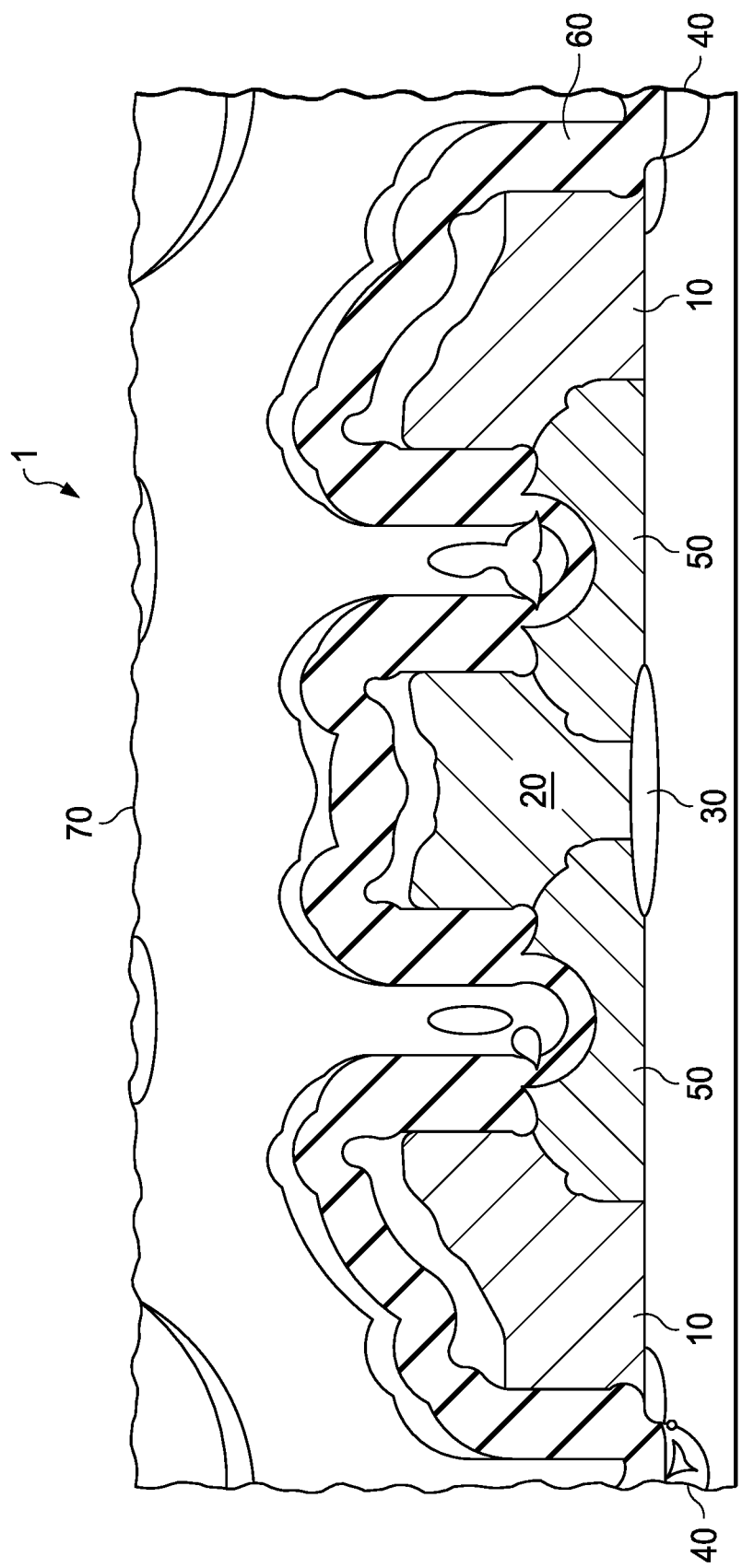
FIG. 1 is a drawing illustrating components of a prior art flash memory cell.
Figure 2A:
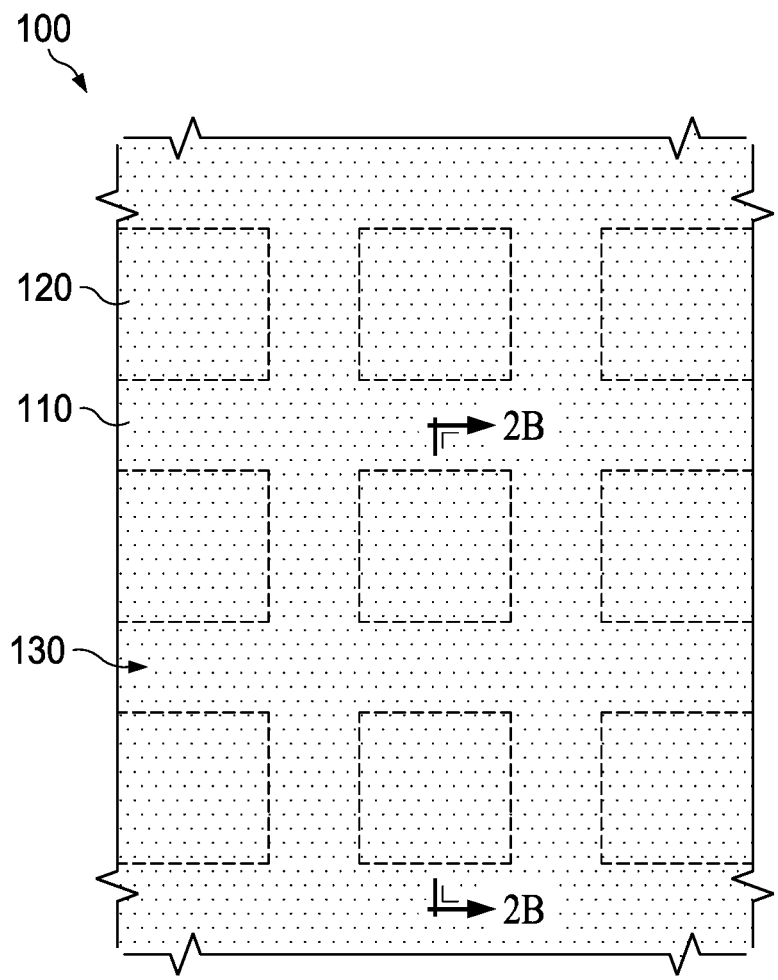
FIGS. 2A and 2B are schematic drawings showing portions of a manufacturing process according to teachings of the present disclosure.
Figure 2B:
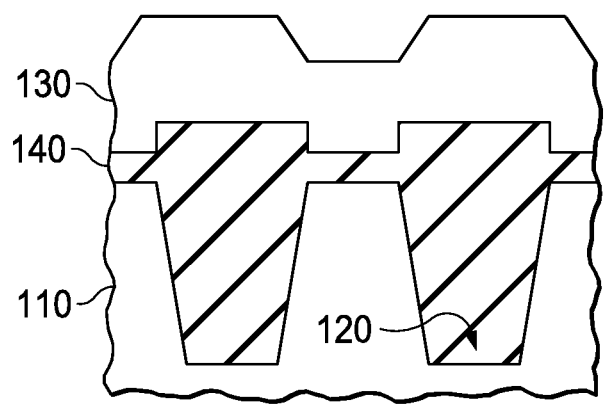

FIGS. 2A and 2B are schematic drawings showing portions of a manufacturing process according to teachings of the present disclosure. The manufacturing process may begin with a substrate prepared by shallow trench isolation to define and separate active sections 110. The trenches 120 electrically isolate various active components to prevent a parasitic connection. A floating gate oxide layer 140 may be deposited atop the substrate 100, and then a floating gate polysilicon layer 130 may be deposited atop the floating gate oxide layer 140. FIG. 2B shows a cross-section of the array shown in FIG. 2A.

Figure 3A:
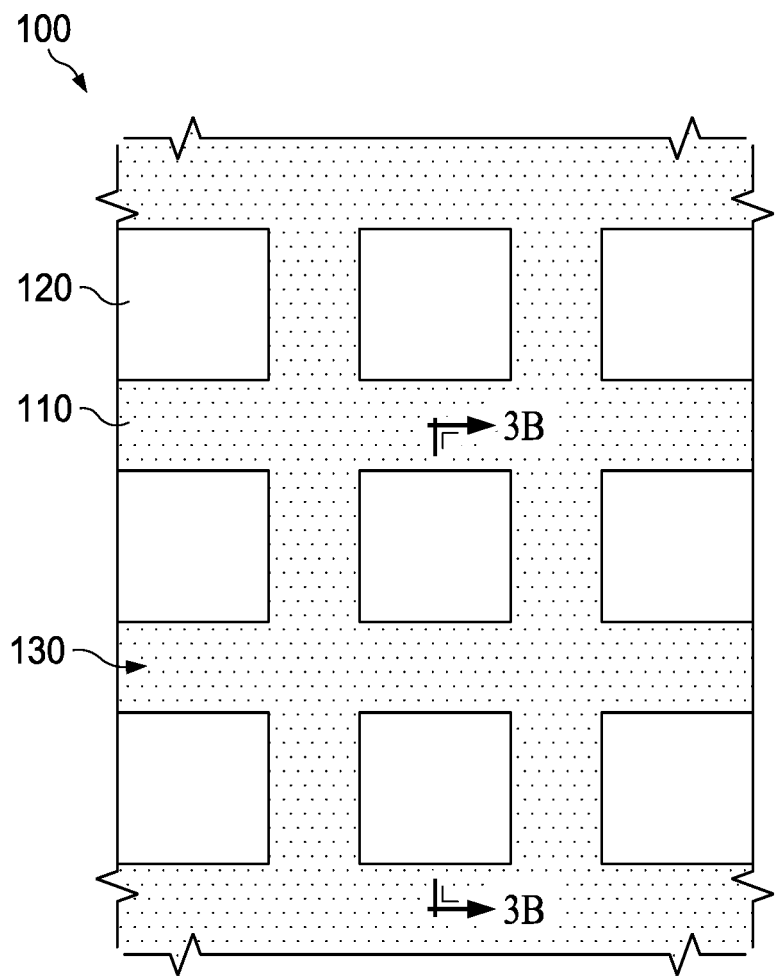
FIGS. 3A and 3B are schematic drawings showing portions of a manufacturing process according to teachings of the present disclosure.
Figure 3B:
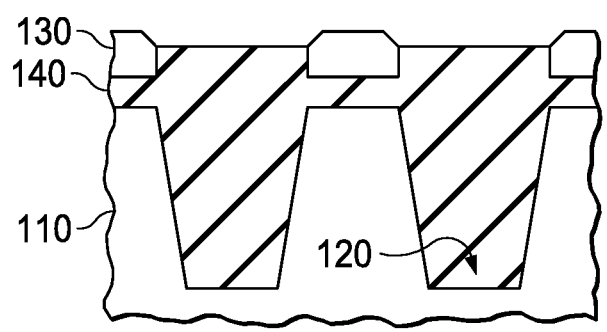

FIGS. 3A and 3B are schematic drawings showing portions of a manufacturing process according to teachings of the present disclosure. The process may include polishing the floating gate polysilicon layer 130 to isolate a plurality of floating gates above the active sections 110 of the substrate 100.

FIGS. 4A-4C are schematic drawings showing portions of a manufacturing process according to teachings of the present disclosure. The process may include depositing a silicon nitride layer 150 on top of the plurality of floating gates and then patterning and etching the silicon nitride layer 150 to create silicon nitride features as shown in FIG. 4C. The features may be created by depositing a photoresist layer 160, creating a pattern in the photoresist layer 160 (e.g., by selectively exposing and removing the photoresist to create the desired features), and by etching the silicon nitride layer 150 where exposed by the removed photoresist. The process may include depositing and etching oxide spacers 170 along the sides of the remaining silicon nitride features.

Figure 5A:
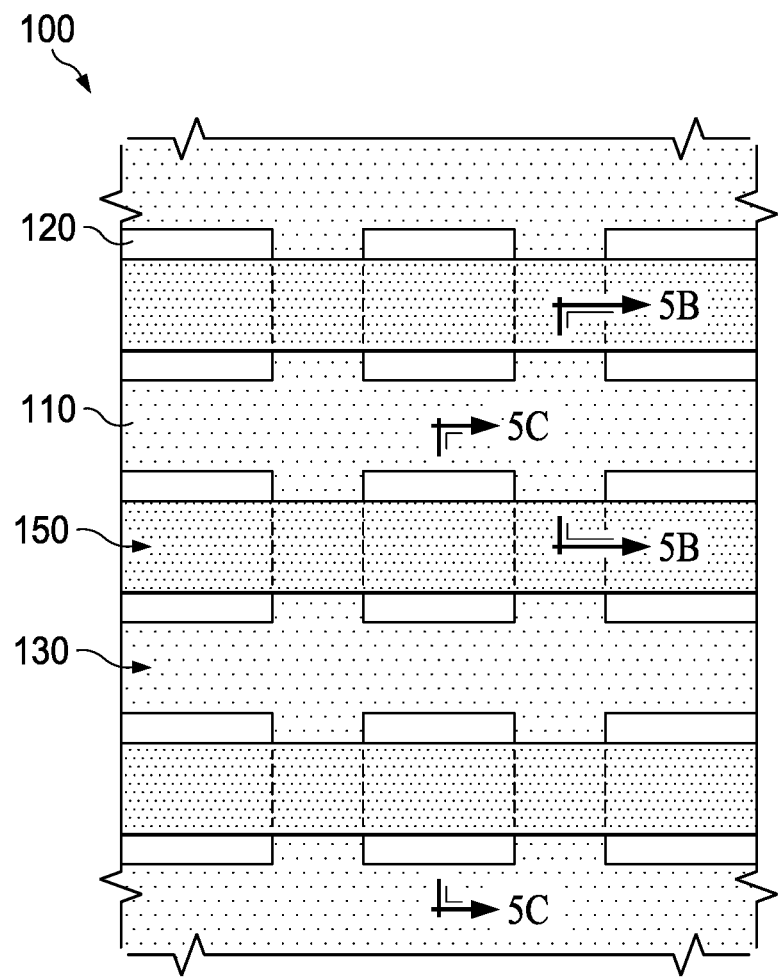
FIGS. 5A-5C are schematic drawings showing portions of a manufacturing process according to teachings of the present disclosure.
Figure 5B:
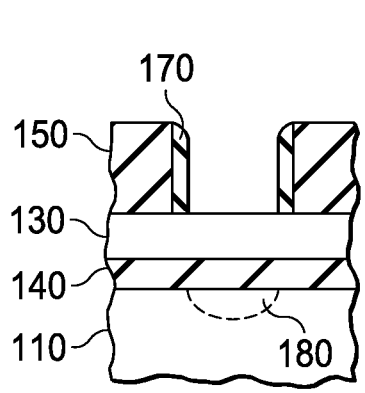
Figure 5C:
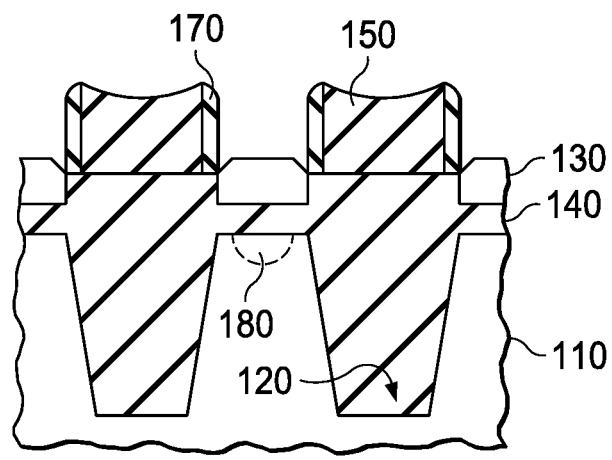

FIGS. 5A-5C are schematic drawings showing portions of a manufacturing process according to teachings of the present disclosure. The process may include implanting a source junction 180 into the substrate 100 beneath the individual floating gates 170. The process may include any appropriate method for implanting source junction 180. FIGS. 5B and 5C show cross-sections taken at different positions along substrate 100.

Figure 6A:
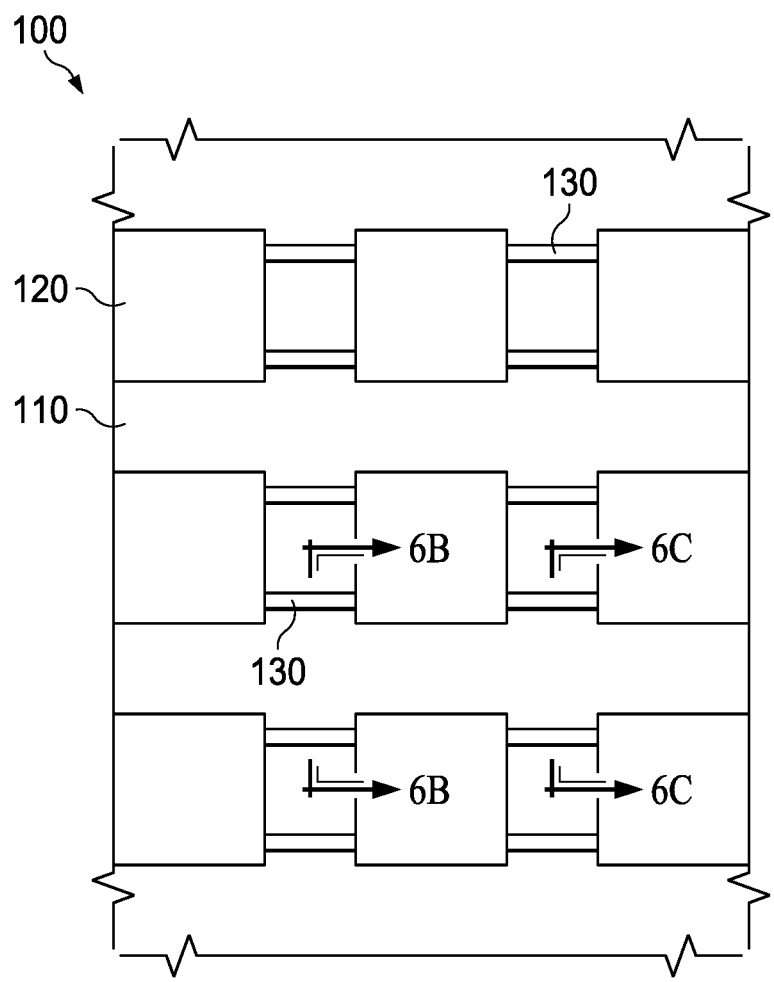
FIGS. 6A-6C are schematic drawings showing portions of a manufacturing process according to teachings of the present disclosure.
Figure 6B:
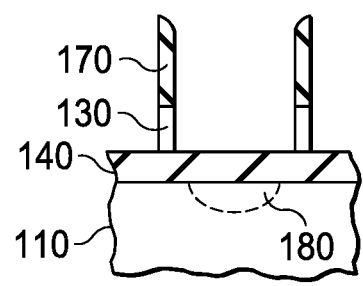
Figure 6C:
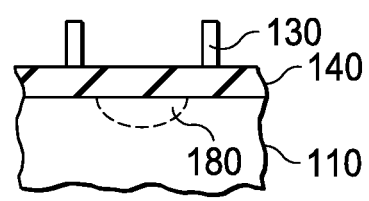

FIGS. 6A-6C are schematic drawings showing portions of a manufacturing process according to teachings of the present disclosure. The process may include removing the nitride layer 150 and the floating gate polysilicon layer 130 except where it is beneath individual oxide spacers 170, then removing the set of oxide spacers 170. The floating gate polysilicon layer may be removed by an etch process. The set of oxide spacers 170 may be removed by any appropriate method, leaving floating gates 130 as shown in FIG. 6C.

Figure 7A:
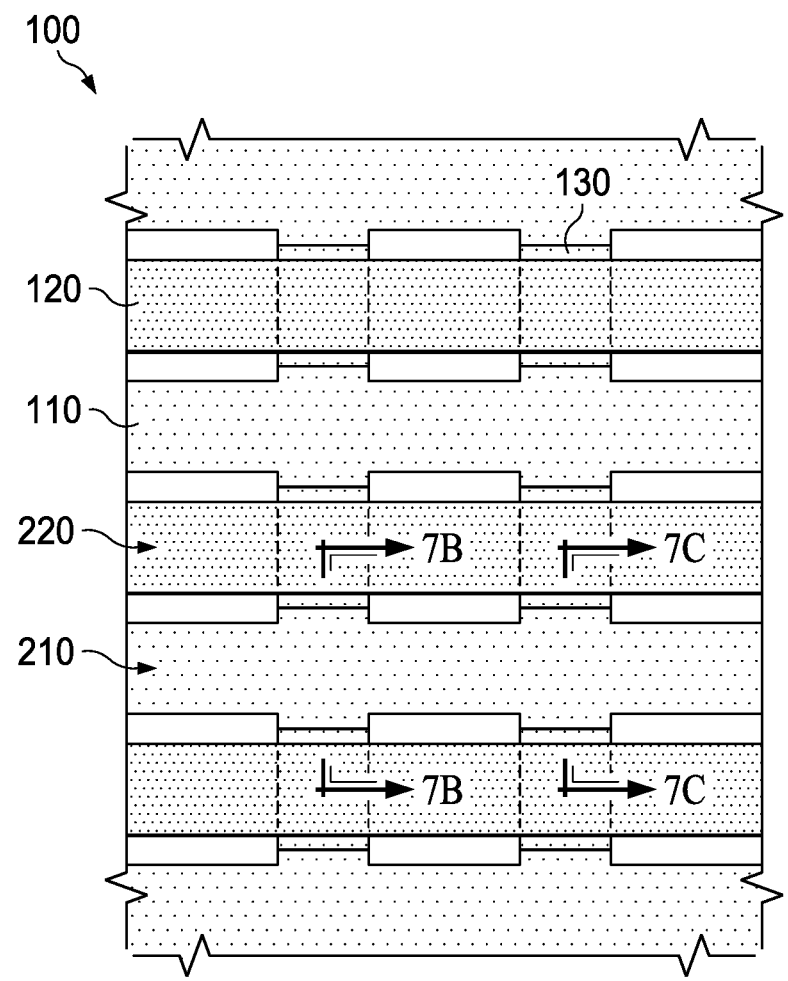
FIGS. 7A-7C are schematic drawings showing portions of a manufacturing process according to teachings of the present disclosure.
Figure 7B:
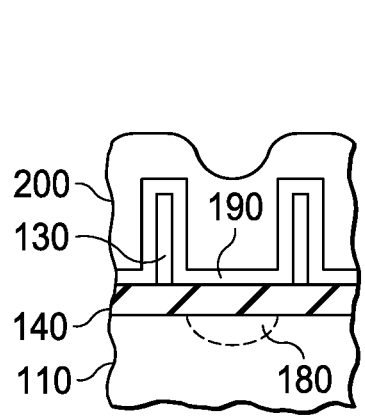
Figure 7C:
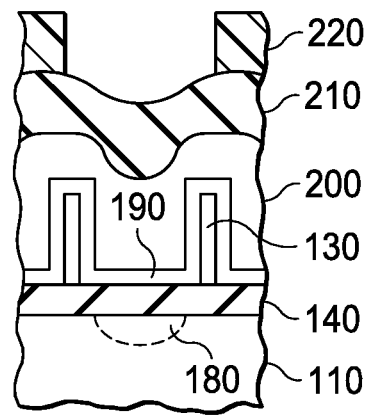

FIGS. 7A-7C are schematic drawings showing portions of a manufacturing process according to teachings of the present disclosure. The process may include depositing an inter-poly layer 190 on top of the remaining floating gates 130 and depositing a second polysilicon layer 200 on top of the inter-poly layer 190. As shown in FIG. 7B, the inter-poly layer 190 may have a generally uniform thickness while the second polysilicon layer 200 may have a less regular profile and/or thickness. FIG. 7C shows an additional layer of silicon nitride 210 deposited on top of the second polysilicon layer and a second layer of photoresist 220 which has been patterned and etched to expose portions of the additional silicon nitride layer 210.

Figure 8A:
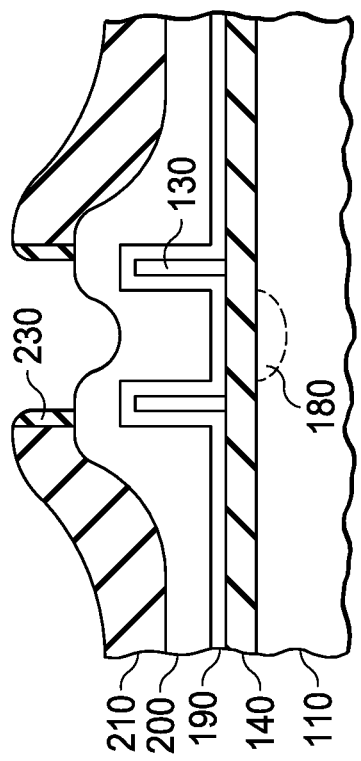
FIGS. 8A-8D are schematic drawings showing portions of a manufacturing process according to teachings of the present disclosure.

FIGS. 8A-8D are schematic drawings showing portions of a manufacturing process according to teachings of the present disclosure. The process may include patterning and etching the second polysilicon layer 200 to separate the second polysilicon layer into word line devices 250 and erase gates 260. As shown in FIG. 8A, the additional silicon nitride layer 210 has been patterned and etched using the second photoresist 220. A second set of oxide spacers 230 have been defined along the exposed sides of the additional silicon nitride layer 210.

Figure 8B:
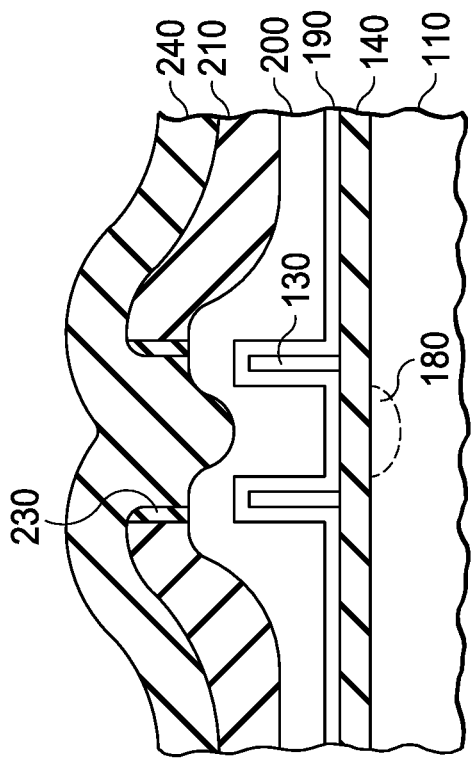

FIG. 8B shows a third layer of silicon nitride 240 laid on top of the second layer 210. The third layer of silicon nitride 240 may have a thickness greater than one-half of the distance between the floating gates 130. For example, the distance between the floating gates 130 may be approximately 390 nanometers and, in that case, the thickness of the third layer of silicon nitride 240 may be more than 195 nanometers.

Figure 8C:
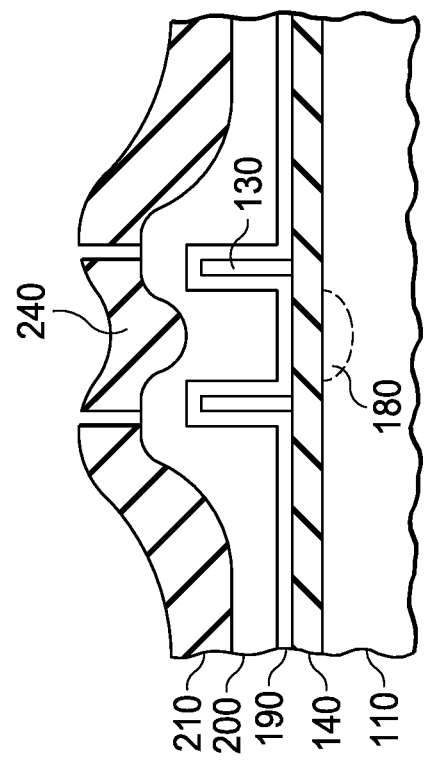
Figure 8D:
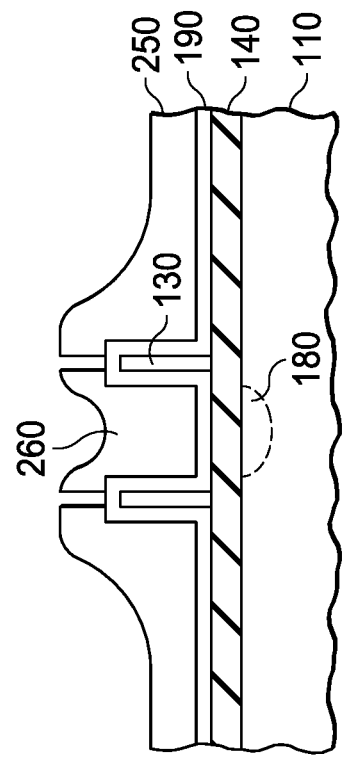

FIG. 8C shows the third layer of silicon nitride 240 after most of it has been etched away, leaving a portion filling the space between the second set of oxide spacers 230. The oxide spacers 230 may be removed, exposing a portion of the polysilicon layer 200 above the floating gates 130. Then, as shown in FIG. 8D, the polysilicon layer 200 may be etched through the holes left by the oxide spacers 230 to separate write line device 250 from the erase gate 260.

Figure 9:
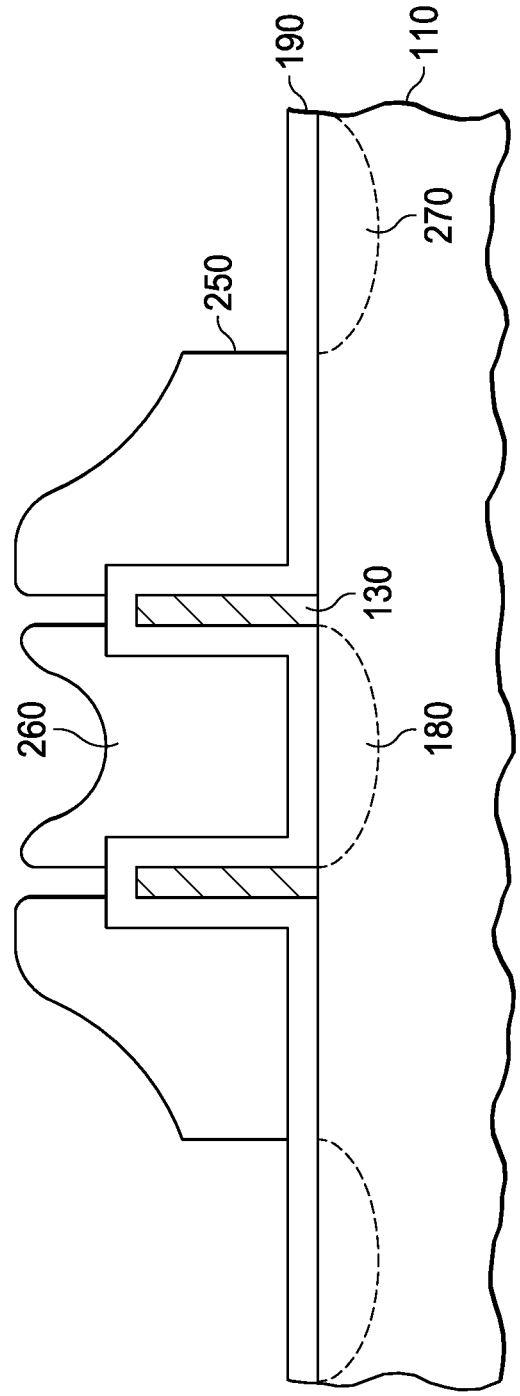
FIG. 9 is a schematic drawing showing portions of a flash memory cell made using a manufacturing process according to teachings of the present disclosure.

FIG. 9 is a schematic drawing showing portions of a flash memory cell made using a manufacturing process according to teachings of the present disclosure. The embodiment shown in FIG. 9 includes two floating gates 130 surrounded by an oxide layer 190. The floating gates 130 may be connected to the source line junction 180 through the erase gate 260. The floating gates 130 may be connected to a bit line junction 270 and/or a drain junction through the word line devices 250 (e.g., the select gates). In the embodiment shown, the word line devices 250 and the erase gate 260 may have dimensions of approximately 0.18 or 0.19 nanometers, and the gap between the two may be approximately 0.04 micrometers.

Figure 10:
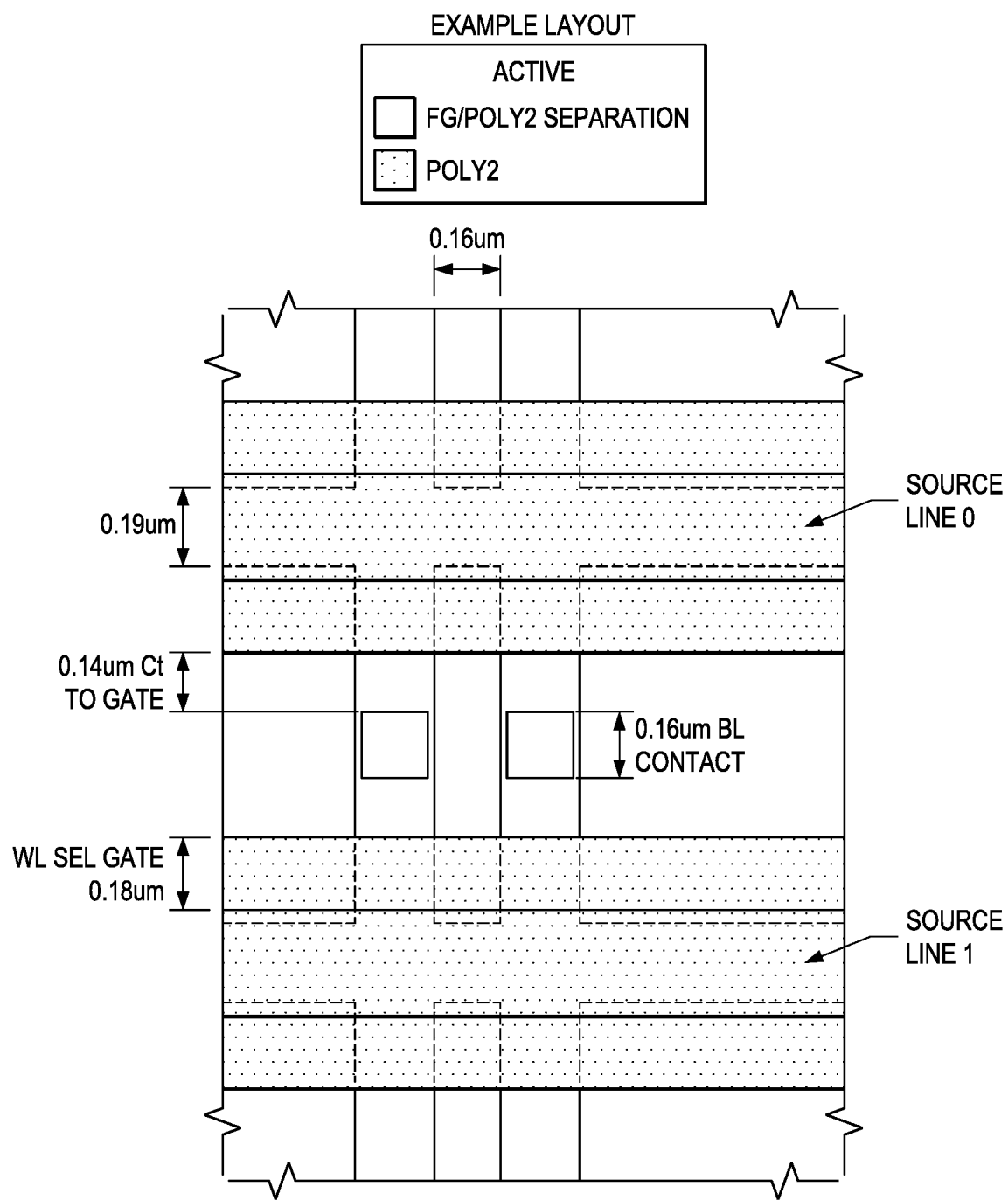
FIG. 10 is a schematic drawing showing portions of an array of flash memory cells made using a manufacturing process according to teachings of the present disclosure.

FIG. 10 is a schematic drawing showing portions of an array of flash memory cells made using a manufacturing process according to teachings of the present disclosure.

The invention claimed is:

1. A method for manufacturing a flash memory device on a substrate, the method comprising:
    preparing the substrate with shallow trench isolation to define and separate active sections;
    depositing a floating gate oxide layer on the prepared substrate;
    depositing a floating gate polysilicon layer on the floating gate oxide layer;
    polishing the floating gate polysilicon layer to isolate a pair of floating gate structures above the active sections of the substrate;
    depositing a silicon nitride layer on top of the floating gate structures;
    patterning and etching the silicon nitride layer to create silicon nitride features;
    depositing oxide sidewall spacers on lateral sidewalls of the silicon nitride features, each oxide sidewall spacer having a lateral width;
    implanting a source junction into the substrate between the floating gate structures;
    removing portions of the floating gate polysilicon layer except for areas beneath the oxide sidewall spacers, thereby defining a vertically elongated floating gate under each oxide sidewall spacer, each vertically elongated floating gate having a lateral width corresponding to the lateral width of the oxide sidewall spacer over that vertically elongated floating gate;
    removing the oxide sidewall spacers;
    depositing an inter-poly layer on top of the vertically elongated floating gates;
    depositing a second polysilicon layer on top of the inter-poly layer; and
    patterning and etching the second polysilicon layer to separate the second polysilicon layer into word line devices and erase gates.

2. A method according to claim 1, wherein patterning and etching the silicon nitride layer includes:
    depositing a photoresist layer on the silicon nitride layer;
    patterning the photoresist layer; and
    etching the silicon nitride layer where exposed by the photoresist layer.

3. A method according to claim 1, wherein each oxide spacer has a dimension of about 120 nanometers.

4. A method according to claim 1, wherein each vertically elongated floating gates has a dimension of about 120 nanometers.

5. A method according to claim 1, wherein the second polysilicon layer has a thickness greater than one half times a distance between the pair of vertically elongated floating gates.

6. A method according to claim 1, wherein a distance between the pair of vertically elongated floating gates is approximately 390 nanometers.

7. A method according to claim 1, wherein the word line devices have a dimension of approximately 0.18 micrometers.

8. A method according to claim 1, wherein a gap between the word line devices and the erase gate is approximately 0.04 micrometers.

9. A flash memory device comprising:
    a substrate with shallow trench isolation defining and separating active sections;
    a floating gate oxide layer disposed on the substrate;
    a pair of floating gates above the active sections of the substrate, each floating gate being elongated in a vertical direction such that a vertical dimension of each floating gate from a bottom end of the floating gate to a top end of the floating gate is greater than a horizontal dimension of that floating gate;
    a source junction implanted into the substrate between the pair of floating gates;
    an inter-poly layer extending over the top end of each of the pair of floating gates; and
    a second polysilicon layer on top of the inter-poly layer, patterned and etched to separate the second polysilicon layer into an erase gate structure located laterally between a pair of word line structures, wherein the erase gate structure extends laterally between the pair of floating gates, and wherein the pair of word line structures and the erase gate structure are physically separated from the pair of floating gates by the inter-poly layer.

10. A flash memory device according to claim 9, wherein each of the floating gates has a dimension of about 120 nanometers.

11. A flash memory device according to claim 9, wherein the second polysilicon layer has a thickness greater than one half times a distance between the pair of floating gates.

12. A flash memory device according to claim 9, wherein a distance between the pair of floating gates is approximately 390 nanometers.

13. A flash memory device according to claim 9, wherein each of the pair of word line structures has a dimension of approximately 0.18 micrometers.

14. A flash memory device according to claim 9, wherein a gap between each of the pair of word line structure and the erase gate structure located laterally between the pair of word line structures is approximately 0.04 micrometers.

* * * * *